United States Patent
Jung et al.

(10) Patent No.: US 7,230,610 B2
(45) Date of Patent: Jun. 12, 2007

(54) KEYPAD IN TEXTILES WITH CAPACITIVE READ-OUT CIRCUIT

(75) Inventors: Stefan Jung, Munich (DE); Christl Lauterbach, Hohenkirchen-Siegertsbrunn (DE)

(73) Assignee: Future-Shape GmbH, Hoehenkirchen-Siegertsbrunn (DE)

( * ) Notice: Subject to any disclaimer, the term of this patent is extended or adjusted under 35 U.S.C. 154(b) by 379 days.

(21) Appl. No.: 10/868,502

(22) Filed: Jun. 14, 2004

(65) Prior Publication Data

US 2005/0069695 A1      Mar. 31, 2005

Related U.S. Application Data

(63) Continuation of application No. PCT/EP02/13748, filed on Dec. 4, 2002.

(30) Foreign Application Priority Data

Dec. 14, 2001   (DE)   ................. 101 61 598
May 8, 2002     (DE)   ................. 102 20 642

(51) Int. Cl.
G09G 5/00       (2006.01)
(52) U.S. Cl. .................. 345/173; 345/156; 345/168
(58) Field of Classification Search ................ 345/173, 345/156, 168
See application file for complete search history.

(56) References Cited

U.S. PATENT DOCUMENTS

| | | | |
|---|---|---|---|
| 4,448,837 A | 5/1984 | Ikeda | |
| 4,659,873 A | 4/1987 | Gibson | |
| 6,049,790 A * | 4/2000 | Rhelimi | ................ 705/73 |
| 6,191,796 B1 * | 2/2001 | Tarr | .................. 345/581 |
| 6,433,057 B1 * | 8/2002 | Bhagwagar et al. | ........ 524/403 |
| 2005/0048279 A1 * | 3/2005 | Watson et al. | ............... 428/332 |

FOREIGN PATENT DOCUMENTS

| | | |
|---|---|---|
| EP | 0 989 509 A2 | 3/2000 |
| GB | WO 01/75922 A1 * | 10/2001 |
| GB | WO 01/88935 A1 * | 11/2001 |
| WO | WO-01/75778 A1 | 10/2001 |
| WO | WO-01/75922 A1 | 10/2001 |

OTHER PUBLICATIONS

Post E R et al; "Smart fabric, or wearable clothing"; Wearable Computers, 1997, Digest of Papers, First International Symposium in Cambridge, MA, USA, Oct. 13-14, 1997; Los Alamitos, CA, USA, IEEE Comput. Soc, US, Oct. 13, 1997, pp. 167-168, XP010251560; ISBN: 0-8186-8192-0.

Farringdon J et al; "Wearable Sensor Badge & Sensor Jacket for Context Awareness"; Wearable Computers, 1999, Digest of Papers, The Third International Symposium in San Francisco, CA, USA, Oct. 18-19, 1999, Los Alamitos, CA, USA, IEEE Comput. Soc, US, Oct. 18, 1999, pp. 107-113, XP010360090, ISBN: 0-7695-0428-0.

Billinghurst M et al.; "New ways to Manage Information"; COMPUTER, IEEE Computer Society, Long Beach, CA, USA, vol. 32, No. 1, Jan. 1999, pp. 57-64, XP000833471, ISSN: 0018-9162.

Post E R et al; "E-broidery: Design and fabrication of textile-based computing"; IBM Systems Journal, vol. 39, Nos. 3 & 4, 2000, pp. 840-860.

* cited by examiner

Primary Examiner—Richard Hjerpe
Assistant Examiner—Leonid Shapiro
(74) Attorney, Agent, or Firm—Dickstein Sharpiro LLP

(57) ABSTRACT

Input apparatus including at least one textile fabric carrier, at least one flexible, wire-and/or thread-like electrical conductor comprising at least one weft and/or warp thread of the fabric carrier, and at least one electrically conductive, flexible key device which is electrically connected to a key connection of the conductor, wherein the conductor is designed for the connection of an evaluation device.

17 Claims, 5 Drawing Sheets

KEYPAD IN TEXTILES WITH CAPACITIVE READ-OUT CIRCUIT

CROSS-REFERENCE TO RELATED APPLICATION

This application is a continuation of International Patent Application Serial No. PCT/EP02/13748, filed Dec. 4, 2002, which published in German on Jun. 26, 2003 as WO 03/052541, and is incorporated herein by reference in its entirety.

FIELD OF THE INVENTION

The invention relates to an input apparatus and to a method for producing an input apparatus.

BACKGROUND OF THE INVENTION

The integration of electronic components in textile consumer items, such as e.g. items of clothing, requires not only the implementation of the electronic circuits but also the implementation of an apparatus for data inputting, in particular a tactile user interface. Despite ever more sophisticated possibilities of voice control systems, key inputting is still necessary or desirable in many applications since, on the one hand, voice control systems can only be used to a limited extent in many situations and, on the other hand, key inputs can often be carried out more reliably, more simply and more rapidly. By way of example, a continuously variable volume control cannot be realized in a convenient manner by means of voice control systems.

Known attempts to integrate keyboards or input apparatuses into a textile environment comprise, in particular, incorporating or sewing conventional flexible keyboards into a textile fabric carrier. Furthermore, multilayer material fabric structures are known in which, by means of mechanical actuation, an electrical contact or proximity can be produced in the multilayer construction and read resistively or capacitively. Finally, keyboards whose keys and leads have been embroidered on or sewn on from conductive and nonconductive strips have also been proposed.

Although input apparatuses having a multilayer material fabric structure are well suited to the realization of touch sensors (touch pads) having a high spatial resolution, since a matrix structure prescribed by the textile structure is read, what is disadvantageous is that these systems comprise multilayer textiles and that, at the edge of the input area, in some instances a large number of connections have to be fed to an electronic evaluation device. The likewise known possibility of fitting input keys of a keypad to the textile carrier in particular by embroidery or sewing methods admittedly enables a high degree of freedom with regard to the configuration and arrangement of the key devices, but harbors the disadvantage that this involves a complicated and thus cost-intensive manufacturing step downstream of the textile production method.

Accordingly, it is an object of the invention to specify an input apparatus which can be integrated into a textile environment in a simple manner and which is accessible to an industrial scale manufacturing process. Furthermore, it is an object of the invention to specify a method for producing such an input apparatus.

SUMMARY OF THE INVENTION

According to the invention, an input apparatus comprises
at least one textile fabric carrier;
at least one flexible, wire- and/or thread-like electrical conductor comprising at least one weft and/or warp thread of the fabric carrier;
at least one electrically conductive, flexible key device which is electrically connected to a key connection of the conductor;
the conductor being designed for the connection of an evaluation device.

The wire- and/or thread-like electrical conductor, which forms the signal line of the input apparatus or keyboard, is an integral constituent part of the textile fabric carrier, in which it comprises at least one electrically conductive weft and/or warp thread of the fabric carrier. The textile fabric carrier is understood to be a textile areal structure comprising two thread systems which cross one another in particular at right angles and are referred to—as usual—as warp and weft. The warp lies in the longitudinal direction of the weaving process, while the weft direction runs transversely with respect to the weaving direction. The at least one weft and/or warp thread of the fabric carrier, which imparts conductivity to the electrical conductor, preferably comprises electrically insulating fibers, in particular synthetic fibers, which are spun with an in particular electrically insulated, thin metal wire. As an alternative, it is possible to form the electrical conductor as a thread-like, thin metal wire which represents a weft or warp thread of the fabric carrier. This signal line introduced in the fabric carrier in this way may be formed directly in the process for producing the fabric carrier, so that a subsequent cost-intensive additional process does not have to be performed. Furthermore, a conductor formed in this way also does not represent an extraneous element in the textile environment, as is the case with conventional key devices fitted on textile fabric carriers.

The conductor is electrically connected to an electrically conductive, flexible key device. The key device is preferably fixed directly to the textile fabric carrier, the electrical contact between key device and conductor being effected by means of an electrical connection of the key connection to the key device. The conductor furthermore has an evaluation device, which is designed for the connection of an evaluation device, in particular an integrated circuit. The evaluation device may also be connected to the evaluation connection by interposition of additional conductors.

Preferably, the key device comprises a conductive adhesive, in particular a conductive silicone. Use is preferably made of a polyorganosiloxane which has been formed in electrically conductive fashion by addition of electrically conductive constituents, in particular carbon or carbon black. Such a key device can advantageously be fitted to the textile fabric carrier by means of a printing method, in particular a screen printing method.

Preferably, the key device has a key layer whose layer thickness is small relative to dimensions of the key layer in the layer plane and which is areally fixed to the fabric carrier. The key layer is thus a thin laminar layer which is preferably fitted to the textile fabric carrier in whole-area fashion. The thickness of the key layer is small relative to its lateral dimensions. The key device thus stands out only to a small extent relative to the textile fabric carrier, so that it does not represent an extraneous element in the textile environment. Preferably, the conductor has an electrical insulation, which can be locally removed for electrical connection to the key device. In this case, the insulation is preferably removed in a window-like region at or on which the key device or the key layer bears. The removal step may be effected in particular by thermal or chemical action, in particular by means of an etching step or by means of laser ablation.

Preferably, the input apparatus comprises a multiplicity of key devices arranged in particular linearly or in matrix-like fashion. A matrix-like arrangement in which the key devices adopt a regular arrangement oriented like a lattice is particularly preferred.

In accordance with a preferred embodiment, the conductors electrically connected to the key devices in each case are electrically connected at crossover points to contact redistribution conductors which run essentially perpendicularly thereto and in each case comprise at least one electrically conductive weft or warp thread of the fabric carrier. This "contact redistribution" of the conductors, serving as signal lines for the key devices, to contact redistribution conductors running essentially perpendicularly thereto enables the conductors, which are often spaced apart from one another comparatively far and irregularly, to be diverted to closely adjacent and regularly arranged contact redistribution conductors. The large distance between the conductors which is often necessary in order to form a textile "keyboard" can thus be adapted to the contact or conductor period of electronic components, which is typically an order of magnitude smaller. In this case, the evaluation device is connected to the contact redistribution conductor. If, by way of example, electrically conductive warp threads of the textile fabric carrier are used as conductors, then the contact redistribution conductors may be formed by weft threads having crossover points with said warp threads.

Preferably, the contact redistribution conductors are arranged in a manner spaced apart uniformly from one another in the fabric carrier. This regular arrangement of the contact redistribution conductors simplifies the connection of external components, in particular external electronic components, to the contact redistribution conductors. The period of the contact redistribution conductors may furthermore be adapted to the typical contact spacings of the evaluation device.

Preferably, the input apparatus comprises an evaluation device for detecting an actuation of at least one of the key devices.

Preferably, a first group of key devices is designed as reference key devices and a second group of key devices is designed as input key devices. An actuation of a key device is present only when the electrical potential of an input key device changes from that of a reference key device by means of an external action, e.g. by means of electrical connection ("short-circuiting") by means of a finger.

Preferably, the evaluation device is designed for evaluating the electrical potential difference or the electrical resistance between one of the input key devices and at least one of the reference key devices. Each input key device is preferably electrically connected directly to the evaluation device, so that the wiring outlay increases linearly with the number of input key devices. The reference key devices can be put at an identical electrical potential, while the electrical potential of the input key devices is determined relative to the potential of the reference key devices by means of a threshold value decision unit. An unavoidable leakage current between the output and reference key devices can be combated by execution of "refresh" cycles which regenerate the electrical potential of the input key devices.

Preferably, the input key devices are connected, by a conductor arranged in the fabric carrier, serially and with high impedance to an input connection of the evaluation device and the reference key devices are connected with low impedance to a reference connection of the evaluation device. This makes it possible to evaluate the actuation of an input key device by means of an analog measurement method, the number of measuring lines being independent of the number of key devices. The input key devices connected with a high impedance form a resistive voltage divider that is designed similarly to the principle of a sliding potentiometer. If an input key device with a reference key device is actuated by proximity of a finger, then the finger touching the key devices represents the "sliding contact" of the sliding potentiometer. Preferably, the evaluation device is designed for detecting an actuation of one of the input key devices by evaluation of the electrical resistance between the input and reference connections.

In accordance with a further preferred embodiment, the evaluation device is designed for outputting a control signal if it detects an actuation of at least two of the key devices in a predetermined temporal sequence. Such a "dynamic pattern recognition" may advantageously be used as a measure against inadvertent actuation processes of the key devices. Conventionally, all that are known are reinforcements or stiffenings of the textile carrier material as protection against folding processes which might initiate erroneous key actuations. Moreover, input apparatuses in textile environments have hitherto been positioned at such locations where these can come into contact with extraneous objects as little as possible. According to the invention, an inadvertent initiation of switching processes can be prevented or minimized in that the evaluation device does not wait for a discrete activity (for example the actuation of a key device), but rather for a "dynamic pattern". A switching operation or the initiation of a control signal is activated only when a multiplicity of key devices have been actuated in a temporally predetermined order. By way of example, it is possible to use input methods similar to the "graffiti alphabet" of conventional electronic organizers (palm PDA), with the difference that control commands are interrogated rather than alphanumeric data.

In accordance with a further particularly preferred embodiment, the evaluation device is designed for capacitively detecting an actuation of at least one of the key devices. The evaluation device thus represents a capacitance sensor which is designed for detecting changes in the capacitance of the key device with respect to the environment. By way of example, the capacitance sensor is designed to detect the change in capacitance of the key device which concomitantly occurs when an object (e.g. a finger) is brought close to said device. Key device and evaluation device thus form a capacitive proximity switch which, in particular, can detect the contactless actuation of a key device.

An evaluation device which evaluates not only the capacitance of the key device with respect to its environment but also the rate of change of said capacitance with respect to time (dC/dt) is particularly preferred. This makes it possible to realize a capacitive proximity switch having a dynamic detection or switching distance (distance between finger and key device). The greater the speed at which the object approaches the key device, the greater the detection distance. Capacitive proximity switches from EDISEN-electronic GmbH, Lauchhammer, Germany, for example the proximity switch "Minitaster MT0.2", have proved to be particularly suitable.

An essential advantage of a capacitive evaluation device is the possibility of being able to actuate key devices without electrical contact being made between finger and key device. Preferably, the evaluation device is designed in such a way that an actuation of a key device can be detected without the latter having to be touched—for example by a finger. In the case of a capacitive evaluation of key actuations, the key devices can thus be covered by an electrical insulator. By way of example, the method of capacitive detection of key actuations also still functions through relatively thick electrically nonconductive substances covering the key device(s). As already described above, the entire input apparatus may be encapsulated for example with plastic (e.g. a textile hot melt adhesive as is used as standard in the field of textiles) and thus be insulated, mechanically stabilized and sealed in machine-washable/cleaning-proof fashion.

Preferably, the input apparatus comprises an electrical shielding device, which is designed for electrically shielding at least one of the key devices from a side of the textile fabric carrier. The shielding device is designed to prevent electrical or electromagnetic interference influences from that side of the textile fabric carrier from which actuation of the key device is not intended to be effected. If the input apparatus is integrated into an item of clothing, for example, then the shielding device prevents an inadvertent actuation of the key device from the body side of the wearer of the item of clothing. Inadvertent actuations of the key device which might be initiated by variation of the distance between item of clothing and body of the wearer can be avoided by means of a shielding device fitted on the body side.

Preferably, the shielding device is a thin conductive layer which is arranged in a manner spaced apart from and running essentially parallel to the at least one key device. Preferably, the shielding device has a thin electrically conductive layer, which is preferably flexible. By way of example, the conductive layer is a metal-coated plastic film, a textile fabric with a high proportion of electrically conductive threads, a metal foil or a textile material printed with conductive ink. The conductive layer is preferably arranged onto the textile fabric carrier in the region of the key device(s). Preferably, the shielding device or the conductive layer is connected to ground.

According to the invention, a method for producing an input apparatus, preferably an input apparatus in accordance with the embodiments described above, comprises the following steps:

provision of a textile fabric carrier having at least one flexible, wire- and/or thread-like electrical conductor comprising at least one weft and/or warp thread of the fabric carrier;

fitting of an electrically conductive, flexible key device electrically connected to a key connection of the conductor; and connection of an evaluation device to the conductor.

Preferably, the key device is fitted by means of a printing method, in particular a screen printing method. This enables the simple production—accessible to mass production—of key devices which are fixed to the textile fabric carrier such that they are well embedded in the textile environment. Preferably, an electrical insulation of the conductor is locally removed before the step of fitting the key device.

BRIEF DESCRIPTION OF THE DRAWINGS

The invention is described by way of example below with reference to accompanying drawings of preferred embodiments, in which.

DETAILED DESCRIPTION OF THE PREFERRED MODE OF THE INVENTION

Figure 1:
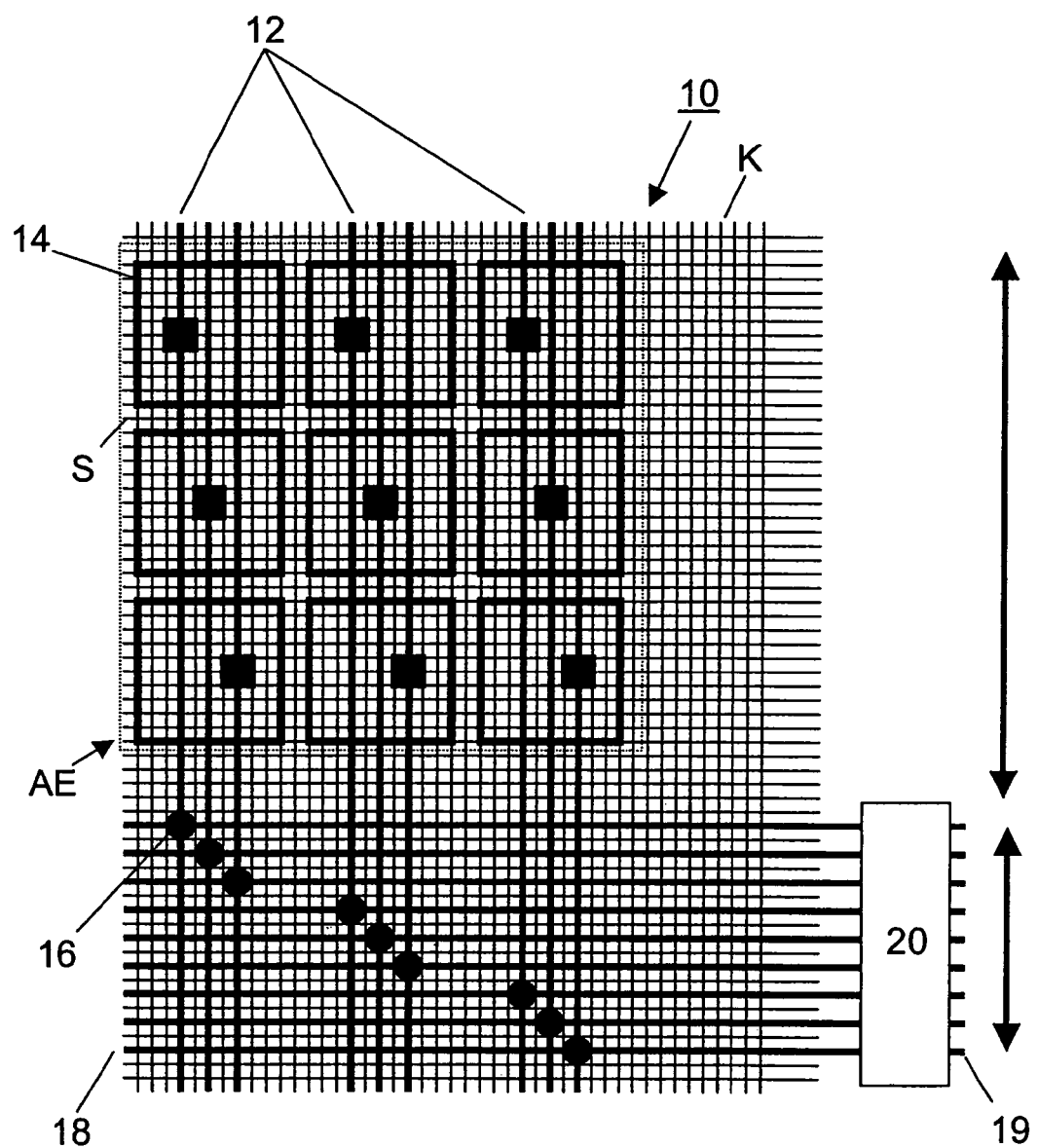
FIG. 1 shows a schematic plan view of an embodiment of an input apparatus according to the invention, the conductors being fed to an evaluation device by means of contact redistribution conductors.

FIG. 1 illustrates a first preferred embodiment of an input apparatus according to the invention. 10 designates a textile fabric carrier having a multiplicity of warp threads K and weft threads S. The warp and weft threads K, S preferably for the most part comprise electrically insulating synthetic fibers and are thus insulators. Some selected synthetic fibers thereof have spun-in thin metal wires, however, which are electrically insulated. Electrical conductivity is thereby imparted to these selected warp and weft threads, so that they represent wire- and/or thread-like electrical conductors 12. The electrically conductive warp and weft threads K, S, which in each case form a conductor 12 in the embodiment shown in FIG. 1, are highlighted by a thicker line width in FIG. 1. It is also possible for a plurality of—in particular adjacent—electrically conductive warp and weft threads to be interconnected to form an electrical conductor 12, for redundancy reasons.

Key devices 14 (for example made of conductive silicone) arranged in matrix-like fashion are fixed on the fabric carrier 10, said key devices in each case being electrically conducted to a conductor 12 extending in the warp direction. For this purpose, in the production method, the electrical insulation of the conductors 12 which are connected to the assigned key devices 14 was removed in a window-like region highlighted in FIG. 1, so that a key layer of the key device 14 can make direct contact with the thin conductive metal layer. It is likewise possible, however, in order to improve the electrical contact between the conductors 12 and the assigned key devices 14, to fit electrical auxiliary contact devices to the conductors 12 in the region of the key devices 14.

The 3×3 key arrangement illustrated in FIG. 1 typically has a lateral dimension indicated by the arrow of 2 to 10 cm, preferably 5 cm. Since the key devices 14 preferably comprise a thin flexible material which is fitted directly onto the fabric carrier 10 and no external signal lines in addition to the conductors 12 are required, the result is an input apparatus which is excellently embedded in the textile environment. As is illustrated in FIG. 1, the nine conductors 12 extending in the warp direction are electrically connected at crossover points 16 to contact redistribution conductors 18 extending in the weft direction of the fabric carrier 10. By virtue of the targeted electrical connection of the conductors 12 to the contact redistribution conductors 18 at the crossover points 16, it is possible to produce predetermined electrical connections between the horizontally and vertically running conductive threads. This makes it possible for the conductors 12, which are spaced apart irregularly and in part are far away from one another, to be diverted to more closely adjacent, periodically arranged contact redistribution conductors 18. This significantly simplifies the connection of an evaluation device 20.

If the evaluation device 20 is a capacitive evaluation device (a capacitance sensor), a shielding device AE is preferably provided, which prevents an undesirable capacitive actuation of the key devices 14 from a side of the fabric carrier 10. The shielding device AE (broken line in FIG. 1) may comprise a conductive layer which is electrically insulated from the key devices and runs essentially parallel thereto. It suffices to arrange the shielding device AE in a region of the input apparatus in which the key devices 14 are positioned. The evaluation device 20 is connected via conductors 19, preferably via conductive threads, to a voltage supply (not illustrated) and actuation inputs of electronic components (not illustrated).

Figure 2:
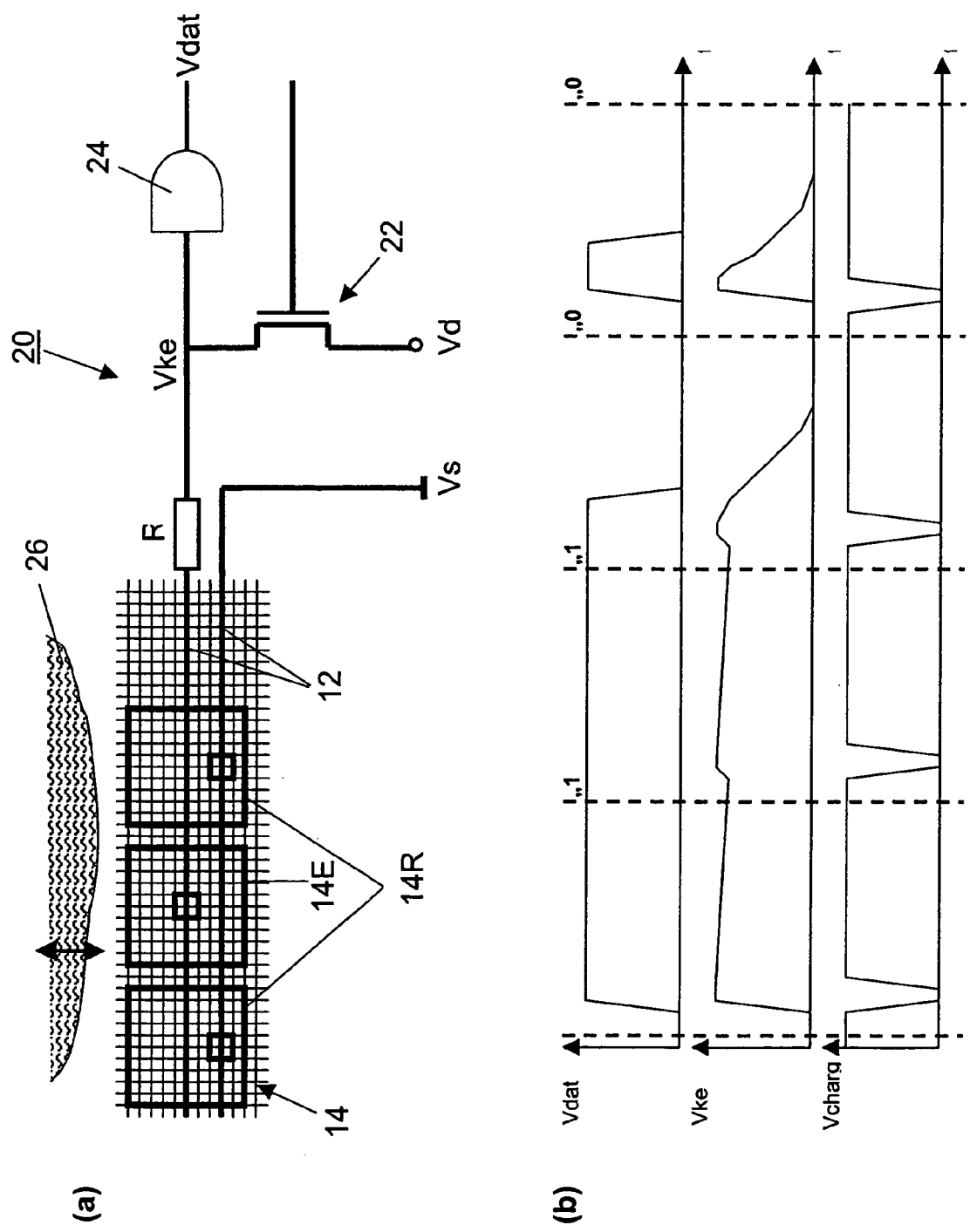
FIGS. 2a and 2b show a schematic circuit diagram of a preferred evaluation device and the voltage/time diagram thereof.

FIG. 2 schematically shows a possible preferred evaluation device 20. In the case of the embodiment shown in FIG. 2($a$), the conductors 12, without contact redistribution conductors 18, are directly connected to the evaluation device 20. A first group of the key devices 14 shown in FIG. 2($a$) can be put at a defined electrical potential, for example at ground potential, via the conductors 12 in order thus to function as reference key devices 14R. A second group of key devices 14 may be directly connected to the active part of the evaluation electronics and represents so-called input key devices 14E.

The input key devices 14E can be charged, under the control of a periodic signal Vcharge, to the potential Vdd via a PMOS transistor 22 and a series resistor R. Furthermore, the source contact of the transistor 22 and the series resistor R are connected to a buffer 24, which functions as a threshold value decision unit and has a high-impedance input. The input of the buffer 24 is at the potential Vkey, while the buffer output is at the potential Vdata. The buffer converts the analog signal Vkey into a binary signal Vdata by threshold value decision. If the key devices 14 are not actuated, i.e. if, in particular, there is no finger 26 lying on the key devices 14, then the input key devices 14E discharge over time due to unavoidable leakage currents. However, as long as Vkey does not fall below a predetermined threshold of the buffer 24, the signal Vdata=1 is present at the buffer output. If a finger 26 having a certain electrical conductivity touches the key devices 14 and short-circuits an input key device 14E with a reference input key device 14R, then said input key device 14E is discharged more rapidly with respect to time, so that, within the "refresh" period, illustrated by vertically running broken lines in FIG. 2($b$), the potential Vkey falls below the set threshold value of the buffer 24. The signal Vdata at the buffer output thus changes from Vdata=1 to Vdata=0, thereby indicating an actuation of the input key device 14.

This temporal profile of the signals Vdata, Vkey and Vcharge is illustrated schematically in a voltage/time diagram in FIG. 2($b$). The periodic "refresh" operations controlled by the signal Vcharge suffices, in the case of the typical leakage currents of the otherwise "floating" input key devices 14E, to hold the node Vkey above the threshold value limit of the buffer 24. As a result of the short circuit between the key devices 14E and 14R, however, the input key device 14E discharges so rapidly that the signal Vdata is set to the value 0.

Figure 3:
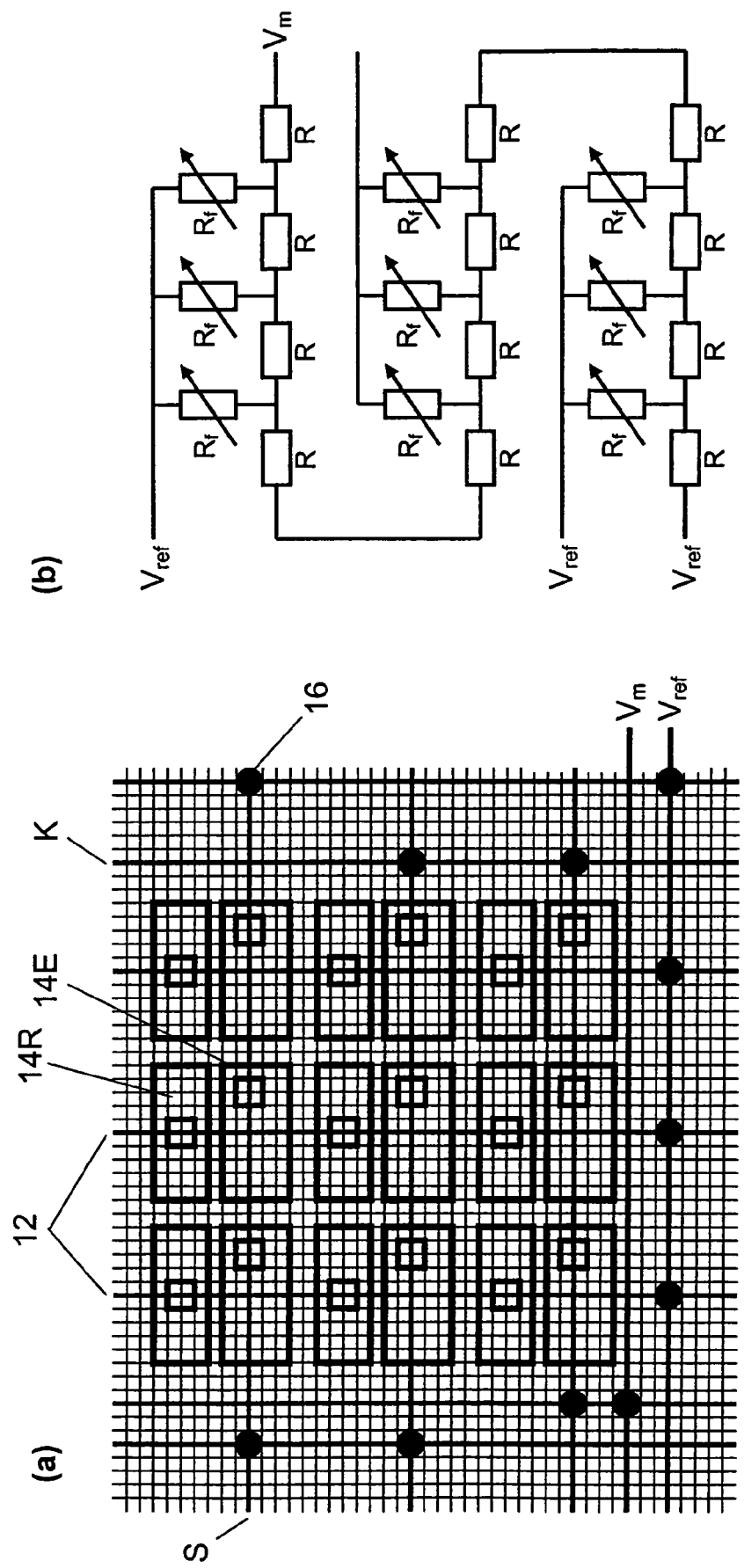
FIGS. 3a and 3b show a schematic plan view of a further preferred embodiment of an input apparatus according to the invention with equivalent circuit diagram.

In the case of this embodiment variant of a possible evaluation device as described in connection with FIG. 2, each key device 14 is directly connected to the evaluation device 20, so that the wiring and circuitry outlay increases linearly with the number of key devices. As an alternative, however, the matrix-like arrangement of the key devices 14 can also be evaluated by means of an analog measurement method, the number of measuring lines being independent of the number of key devices. The embodiment variant illustrated in FIG. 3 has two measuring lines, the connections of which are designated by Vref and Vm. In this case, the key devices 14 are divided into reference key devices 14R and input key devices 14E as in the embodiment illustrated in FIG. 2.

The input key devices 14E are electrically contact-connected, by electrically conductive weft threads S and the reference key devices 14R are electrically contact-connected by electrically conductive warp threads K. Through suitable electrical connections at the crossover points 16 of the electrically conductive warp and weft threads K, S, a circuit is constructed, which is illustrated in a simplified equivalent circuit diagram in FIG. 3($b$). In this case, the contact-connection of the conductive weft and warp threads in the fabric carrier 10 is chosen in such a way that a resistive voltage divider is formed similarly to the principle of a sliding potentiometer. In this case, the touching finger serves as "sliding contact", it being possible to determine the position of the finger on the matrix of the key devices 14 by means of a simple resistance measurement between Vref and Vm, since the input key devices 14$e$ are connected to one another in series.

The reference key devices 14R are jointly put at the potential Vref via electrically conductive warp threads which are configured with low impedance. The input key devices 14E are connected to one another in series via electrically conductive weft threads S with very high impedance. In this case, the resistance R specified in FIG. 3($b$) is the unit resistance of the high-impedance electrically conductive weft threads S relative to the length of the spacing of the key devices 14E. The electrical resistance resulting from the skin conductance of the touching finger is designated by $R_f$ in FIG. 3($b$). The "short-circuit resistance" between adjacent input and reference key devices 14E, 14R is thus $R_f$, where $R_f$ is significantly less than the unit resistance R. If the finger touches an input key device 14E together with a reference key device 14R and short-circuits them with a short-circuit resistance $R_f$, then the position of this actuated input key device 14R can be measured and assigned by means of a resistance measurement between the nodes Vref and Vm.

Figure 4:
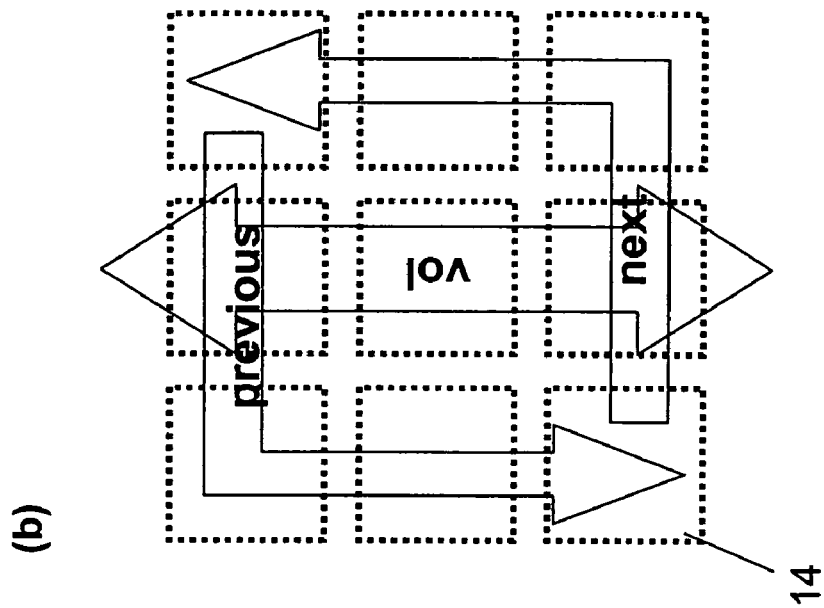
FIGS. 4a and 4b show a schematic basic illustration for a preferred pattern recognition according to the invention.
Figure 4:
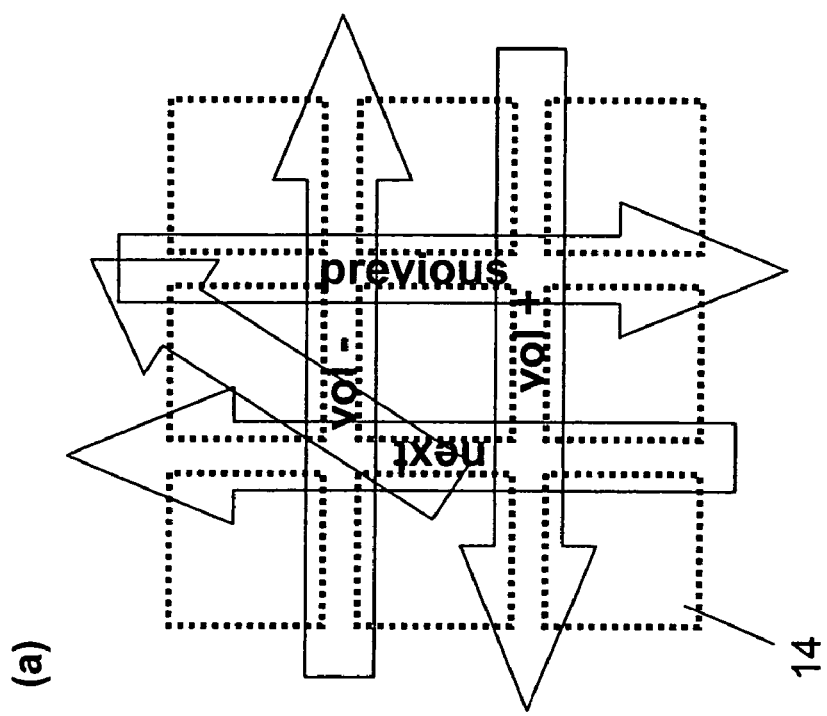

FIG. 4 shows schematic sketches of an embodiment of an evaluation device in which an inadvertent activation or actuation of a switching operation of a key device can be prevented by means of a "dynamic pattern recognition". The evaluation device used in this case is designed for recognizing the temporal order in which the individual key devices 14 of the keypad are activated. It is only if the key devices 14 are actuated and recognized in a predetermined temporal order, i.e. in a specific fixed pattern, that a corresponding control signal is output and an assigned function is performed. In this case, each of the key devices 14 illustrated in FIGS. 4($a$) and ($b$) may in each case comprise an input key device 14E and a reference key device 14R.

As an example, FIGS. 4($a$) and ($b$) specify a variant of a dynamic pattern recognition of a 3×3 keypad which can be used for example for controlling a device for audio reproduction. The arrows in each case represent the sweeping directions of the finger that are expected by the system for a specific control action, or actuation sequences of the key matrix. Volume regulation (vol− and vol+) and skipping forward and back (next, previous) were chosen as an example in this case. If the evaluation device recognizes other, non-predetermined input patterns, for example an input pattern which is represented by the obliquely running arrow in FIG. 4(a), a control signal is not output. Instead, such non-predetermined patterns are rejected by the evaluation device and interpreted as inadvertent actuations.

Figure 5:
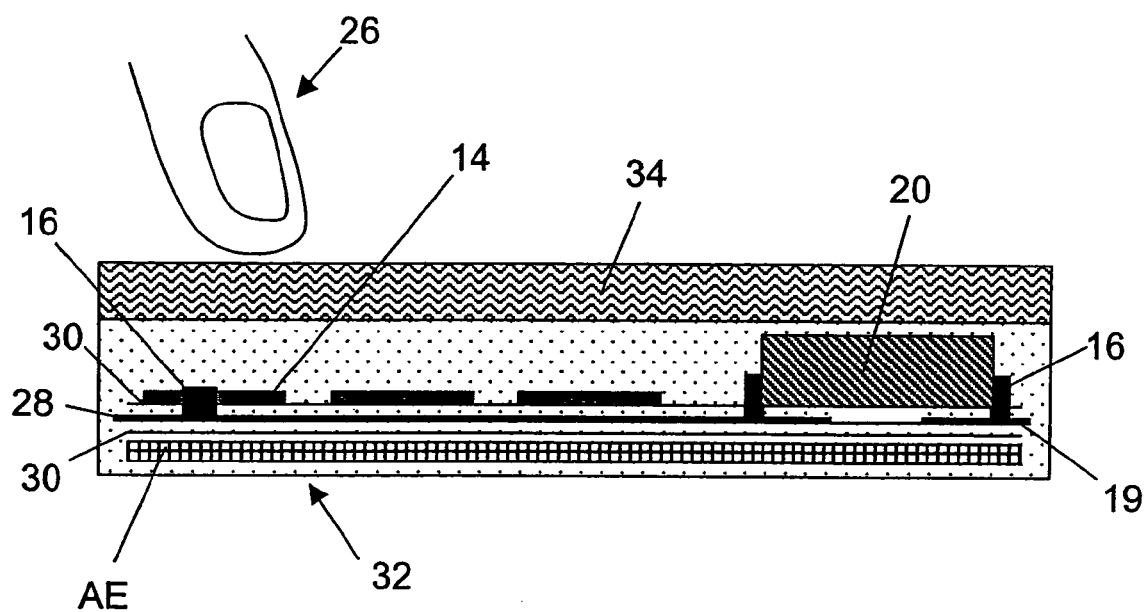
FIG. 5 shows a schematic cross-sectional view of a preferred embodiment of an input apparatus according to the invention with a capacitive evaluation device.

FIG. 5 shows a schematic cross-sectional view through a preferred embodiment of an input apparatus with a capacitive evaluation device 20. The electrical connection of one of the key devices 14 to the evaluation device 20 by means of electrical connections 16 via an electrically conductive thread 28 is shown in cross section. The conductive thread 28 is insulated by electrical insulations 30 from the key devices 14 and the shielding device AE, which represents a ground plate. The capacitive evaluation device 20, i.e. the capacitance sensor, is connected via conductors 19 to a voltage supply (not illustrated) and external circuits which process the output signals of the evaluation device 20. For mechanical and chemical protection, the entire apparatus may be provided with a waterproof encapsulation 32, a textile upper layer 34 preferably being arranged on the surface thereof. On account of the capacitive coupling between the finger 26 and the key device 14, there is no need for an electrically conductive connection between the finger 26 and the key device 14 for the actuation of the key device 14.

In addition to the application of the above-described preferred input apparatuses for data inputting or control in items of clothing, applications as general touch sensors are also conceivable, which may be used for example in material coatings in room decoration, furniture, wall coverings, etc. The keys are preferably made "invisible" in this case by being produced from a transparent conductive silicone adhesive. Only the dynamic patterns to be actuated are represented visibly for example by arrows by means of a color printing on the fabric carrier. In this case, the user does not notice the underlying matrix structure of the key devices.

The invention claimed is:

1. An input apparatus comprising:
   at least one textile fabric carrier;
   flexible, wire-like and/or thread-like electrical conductors, each comprising at least one weft and/or warp thread of the fabric carrier; and
   a plurality of electrically conductive, flexible key devices which are electrically connected to key connections of the conductors, are arranged in linear or in matrix-like fashion, and are in each case electrically connected at crossover points to contact redistribution conductors which run essentially perpendicular to at least one of the conductors and which each comprise at least one electrically conductive weft or warp thread of the fabric carrier;
   wherein at least one of the conductors is designed for connection of an evaluation device.

2. The input apparatus as claimed in claim 1, wherein the key devices comprise conductive silicone adhesive.

3. The input apparatus as claimed in claim 1, wherein each of the key devices has a key layer whose thickness is small relative to its dimensions in the layer plane and which is areally fixed to the fabric carrier.

4. The input apparatus as claimed in claim 1, wherein the conductors have electrical insulation, which is locally removed for electrical connection to the key devices.

5. The input apparatus as claimed in claim 1, wherein the contact redistribution conductors are arranged in a manner spaced apart uniformly from one another in the fabric carrier.

6. The input apparatus as claimed in claim 1, wherein the evaluation device detects an actuation of at least one of the key devices.

7. The input apparatus as claimed in claim 6, wherein a first group of key devices is designed as reference key devices and a second group of key devices is designed as input key devices.

8. The input apparatus as claimed in claim 7, wherein the evaluation device is designed for evaluating electrical potential difference or electrical resistance between one of the input key devices and at least one of the reference key devices.

9. The input apparatus as claimed in claim 7, wherein the input key devices are connected, by a conductor arranged in the fabric carrier, serially and with high impedance to an input connection of the evaluation device and the reference key devices are connected with low impedance to a reference connection of the evaluation device.

10. The input apparatus as claimed in claim 9, wherein the evaluation device is designed for detecting an actuation of one of the input key devices by evaluation of the electrical resistance between the input and reference connections.

11. The input apparatus as claimed in claim 6, wherein the evaluation device is designed for outputting a control signal if it detects an actuation of at least two of the key devices in a predetermined temporal sequence.

12. The input apparatus as claimed in claim 6, wherein the evaluation device is designed for capacitively detecting an actuation of at least one of the key devices.

13. The input apparatus as claimed in claim 12, further comprising an electrical shielding device, which is designed for electrically shielding at least one of the key devices from a side of the textile fabric carrier.

14. The input apparatus as claimed in claim 13, wherein the shielding device is a thin conductive layer arranged spaced apart from and running essentially parallel to the at least one of the key devices.

15. A method for producing an input apparatus comprising the steps of:
   providing a textile fabric carrier having flexible, wire-like and/or thread-like electrical conductors, each comprising at least one weft and/or warp thread of the fabric carrier;
   electrically connecting a plurality of electrically conductive, flexible key devices to key connections of the conductors such that the key devices are arranged in linear or in matrix-like fashion, and are in each case electrically connected at crossover points to contact redistribution conductors which run essentially perpendicular to at least one of the conductors and which each comprise at least one electrically conductive weft or warp thread of the fabric carrier; and
   connecting an evaluation device to at least one of the conductors.

16. The method as claimed in claim 15, wherein the key devices are fitted using a screen printing method.

17. The method as claimed in claim 15, wherein electrical insulation of the conductors is locally removed before the step of electrically connecting the key devices.

* * * * *